United States Patent
Khan et al.

(10) Patent No.: US 8,907,419 B2
(45) Date of Patent: Dec. 9, 2014

(54) LDMOS WITH ENHANCED SAFE OPERATING AREA (SOA) AND METHOD THEREFOR

(75) Inventors: Tahir A. Khan, Tempe, AZ (US); Vishnu K. Khemka, Phoenix, AZ (US); Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 138 days.

(21) Appl. No.: 13/614,722

(22) Filed: Sep. 13, 2012

(65) Prior Publication Data

US 2013/0009243 A1  Jan. 10, 2013

Related U.S. Application Data

(62) Division of application No. 12/769,779, filed on Apr. 29, 2010, now Pat. No. 8,330,220.

(51) Int. Cl.
*H01L 29/66* (2006.01)
*H01L 29/78* (2006.01)
*H01L 29/10* (2006.01)
*H01L 29/06* (2006.01)

(52) U.S. Cl.
CPC ...... *H01L 29/7835* (2013.01); *H01L 29/66659* (2013.01); *H01L 29/0653* (2013.01); *H01L 29/1083* (2013.01)
USPC ............ 257/335; 257/492; 257/E21.135

(58) Field of Classification Search
CPC .............. H01L 29/66681; H01L 29/7816; H01L 29/7824
USPC .......... 257/328, 329–343, E29.027, E29.066, 257/E29.256, E29.26, E29.261, E29.135, 257/492, E21.415; 438/369
See application file for complete search history.

(56) References Cited

U.S. PATENT DOCUMENTS

| | | | |
|---|---|---|---|
| 5,910,670 A | 6/1999 | Ludikhuize | |
| 5,917,203 A * | 6/1999 | Bhatnagar et al. | 257/139 |
| 6,211,552 B1 | 4/2001 | Efland et al. | |
| 6,787,437 B2 * | 9/2004 | Rumennik et al. | 438/526 |
| 6,882,023 B2 | 4/2005 | Khemka et al. | |
| 6,888,210 B2 * | 5/2005 | Jeon et al. | 257/492 |
| 6,989,567 B2 * | 1/2006 | Tornblad et al. | 257/343 |
| 7,368,786 B2 | 5/2008 | Xu et al. | |
| 7,466,006 B2 | 12/2008 | Khemka et al. | |
| 7,626,233 B2 | 12/2009 | Tornblad et al. | |

(Continued)

OTHER PUBLICATIONS

Restriction Requirement mailed Jan. 9, 2012 in U.S. Appl. No. 12/769,779.

(Continued)

*Primary Examiner* — Cuong Q Nguyen
*Assistant Examiner* — Yosef Gebreyesus
(74) *Attorney, Agent, or Firm* — James L. Clingan, Jr.

(57) ABSTRACT

A laterally double diffused metal oxide semiconductor device includes a well region having a first conductivity, a first carrier redistribution region having the first conductivity type, wherein the second well region is under the well region, and a highly doped buried layer under the second well region. The highly doped buried layer has the first conductivity type and has a dopant concentration less than that of the well region and less than that of the first carrier redistribution region, and the buried layer is tied to the first well region. In addition, a method for forming the laterally double diffused metal oxide semiconductor device, which may use epitaxial growth, is disclosed.

6 Claims, 4 Drawing Sheets

(56) References Cited

U.S. PATENT DOCUMENTS

| | | | |
|---|---|---|---|
| 2004/0084744 A1* | 5/2004 | Khemka et al. | 257/492 |
| 2007/0045767 A1 | 3/2007 | Zhu et al. | |
| 2007/0200184 A1 | 8/2007 | Zhu et al. | |
| 2008/0029814 A1* | 2/2008 | Khalil | 257/339 |
| 2008/0237707 A1* | 10/2008 | Suzuki et al. | 257/344 |

OTHER PUBLICATIONS

Non-Final Office Action mailed Mar. 1, 2012 in U.S. Appl. No. 12/769,779.

U.S. Appl. No. 12/769,779, Khan, Tahir A., "LDMOS With Enhanced Safe Operating Area (SOA) and Method Therefor", Office Action—Notice of Allowance, Aug. 10, 2012.

* cited by examiner

US 8,907,419 B2

LDMOS WITH ENHANCED SAFE OPERATING AREA (SOA) AND METHOD THEREFOR

FIELD

This disclosure relates generally to LDMOS, and more specifically, to LDMOS with soft operating area.

RELATED ART

Laterally double diffused MOS (LDMOS) has been very effective for providing control in high power applications. One issue that developed as the ability to dissipate power increased was issues with safe operating area. At operating conditions in which there is both high current and high voltage, impact ionization is high enough to significantly increase the body current, typically P type, so that it forward biases the source-body junction. This particular PN junction was also the base emitter of a parasitic NPN bipolar transistor formed between the extended drain region, the body and source of the LDMOS. When this parasitic transistor became conductive, it entered into a positive feedback mechanism where this current pickup further increased impact ionization causing the parasitic bipolar to become even more conductive. In a matter of milliseconds, the device would be destroyed. A device topology called double RESURF was developed to spread the drain current so that not all of the electrons that crossed the channel to the drain exited at the drain contact. A significant portion of the electrons exited through a buried layer under the drain. This significantly reduced the amount of impact ionization caused as a result of current crowding and thus increased the voltage that the device could pass before reaching the situation where the parasitic bipolar was triggered and would destroy the device. The effectiveness, however, was better if the buried layer was relatively shallow. The relatively shallow buried layer, however, decreased the voltage breakdown between the buried layer and the body which limited the overall blocking capability of the device. Thus, there was a tradeoff between the maximum achievable breakdown of the double RESURF structure and its effectiveness in improving the safe operating area of this device.

Accordingly, there is a need to retain effective control of impact ionization in order to achieve a desirable safe operating area while increasing the breakdown voltage between the buried layer and the body.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an LDMOS device has a buried layer of a first conductivity type and an overlying drain of the same conductivity type. The buried layer and the drain have background region of a second conductivity type between them. Within the background region is a carrier redistribution region of the first conductivity type that is completely surrounded by the background region. During high voltage operation, the drain and buried layer are at a sufficiently high voltage to cause punchthrough between the carrier redistribution region and the buried layer and may be sufficient to cause punchthrough between the drain and the carrier redistribution region. Electrons being attracted toward the carrier redistribution region may actually divert some electrons from the drain region to the buried layer through the carrier redistribution region. Even if electrons are not diverted to the buried layer, some electrons at least take a lower path to the drain contact. In either case the peak current density is reduced. With reduced peak current density, the result is less impact ionization and thus less susceptibility to trigger the parasitic bipolar transistor and destroy the LDMOS. This enables a greater separation between a body region of the LDMOS and the buried layer and thus increasing the breakdown voltage between the body and the buried layer. This is better understood by reference to the following description and the drawings.

Figure 1:
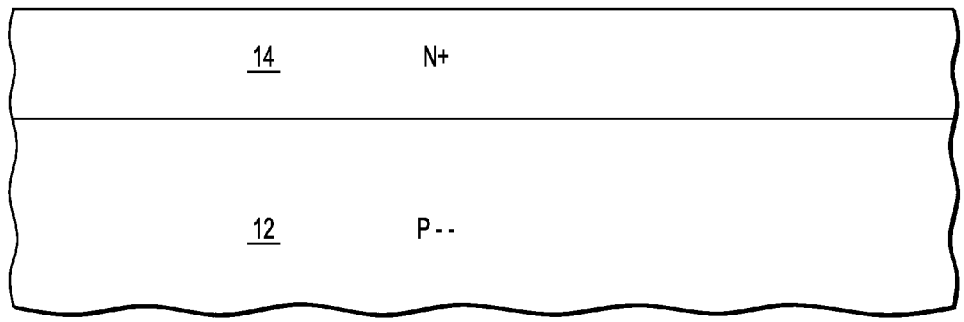
FIG. 1 is a cross section of a semiconductor device at a stage in processing according to an embodiment.

Shown in FIG. 1 is a semiconductor device 10 comprising a substrate 12 and a buried layer 14 on the substrate. The substrate is very lightly doped to P type indicated by P--. The buried layer is heavily doped to N type indicated by N+. Buried layer 14 may be about 1.5 microns thick. Both substrate 12 and buried layer 14 are preferably silicon. Buried layer 14 may be epitaxially grown or implanted.

Figure 2:
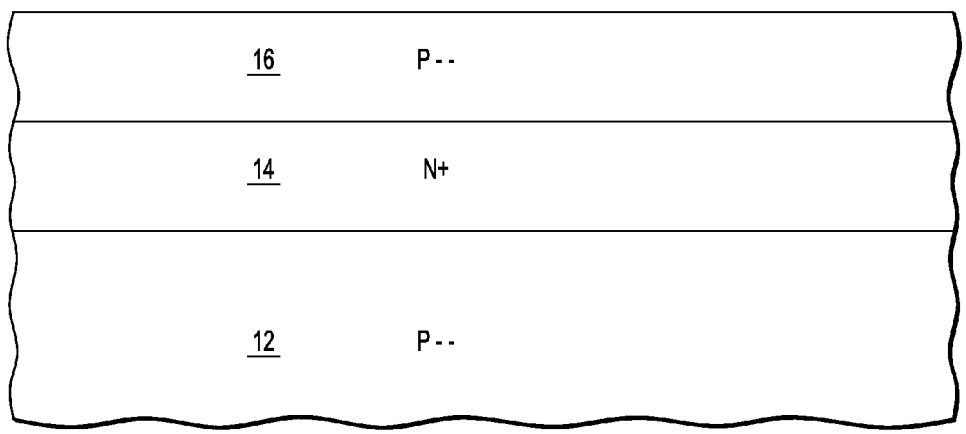
FIG. 2 is a cross section of the semiconductor device of FIG. 1 at a subsequent stage in processing.

Shown in FIG. 2 is semiconductor device 10 after epitaxially growing a layer 16. Layer 16 may be in situ doped or implanted to be very lightly doped P type shown as P--.

Figure 3:
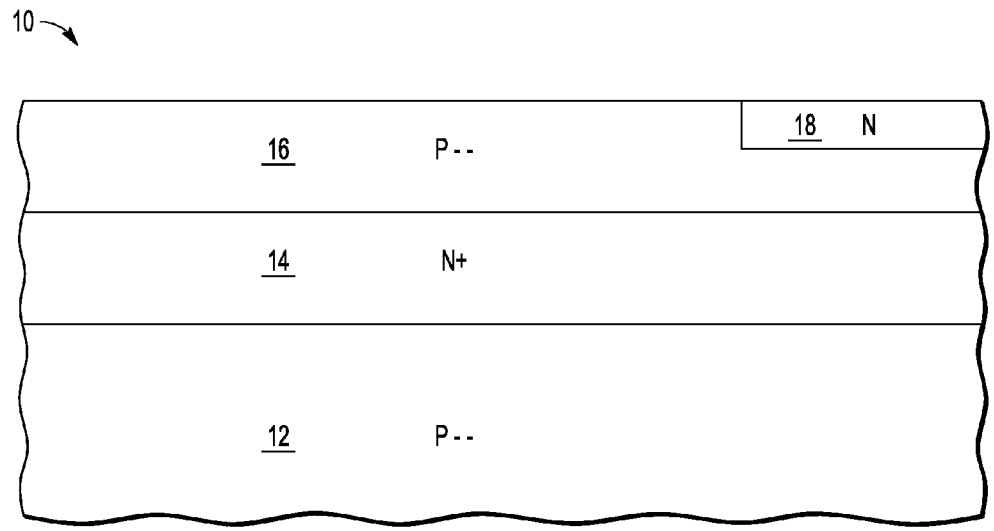
FIG. 3 is a cross section of the semiconductor device of FIG. 2 at a subsequent stage in processing.

Shown in FIG. 3 is semiconductor device 10 after forming a doped region 18 from the top surface of P-- layer 16 to a depth of about 0.5. micron. Doped region 18 functions as a carrier redistribution region and is doped by implanting to be N type and shown as N. The lateral dimension in this example is about 2 microns. In the conductivity types for this example, the carriers that are redistributed by doped region 18 are electrons.

Figure 4:
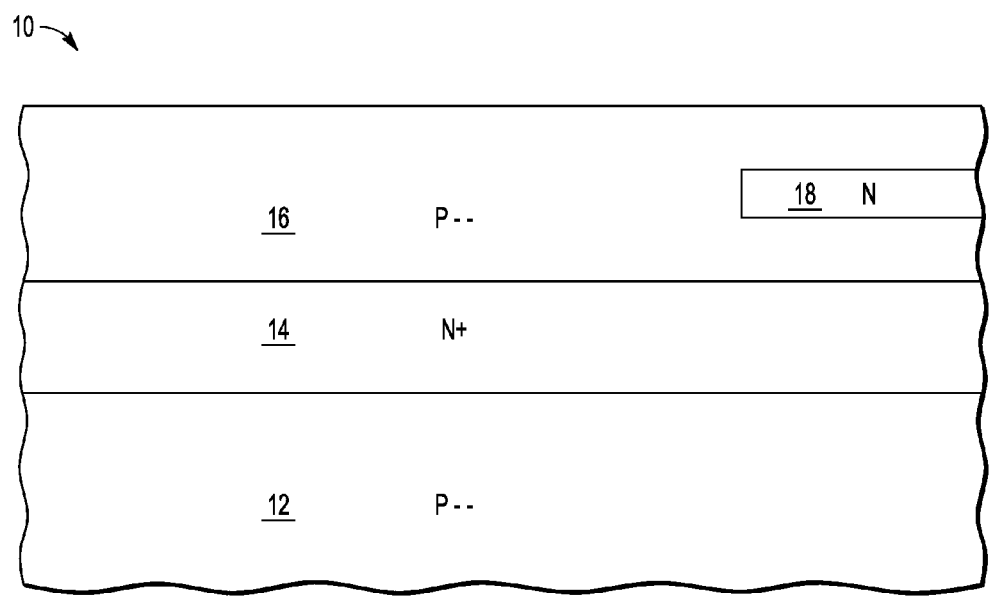
FIG. 4 is a cross section of the semiconductor device of FIG. 3 at a subsequent stage in processing.

Shown in FIG. 4 is semiconductor device after a continued epitaxial growth of P-- layer 16. The result is that doped region 18 is completely surrounded by P-- layer 16. Epitaxial growth of P-- layer 16 continues after what is shown in FIG. 4. The epitaxial growth of P-- layer 16 may be done in stages or in one continuous growth and may referenced as a doped region 16.

Figure 5:
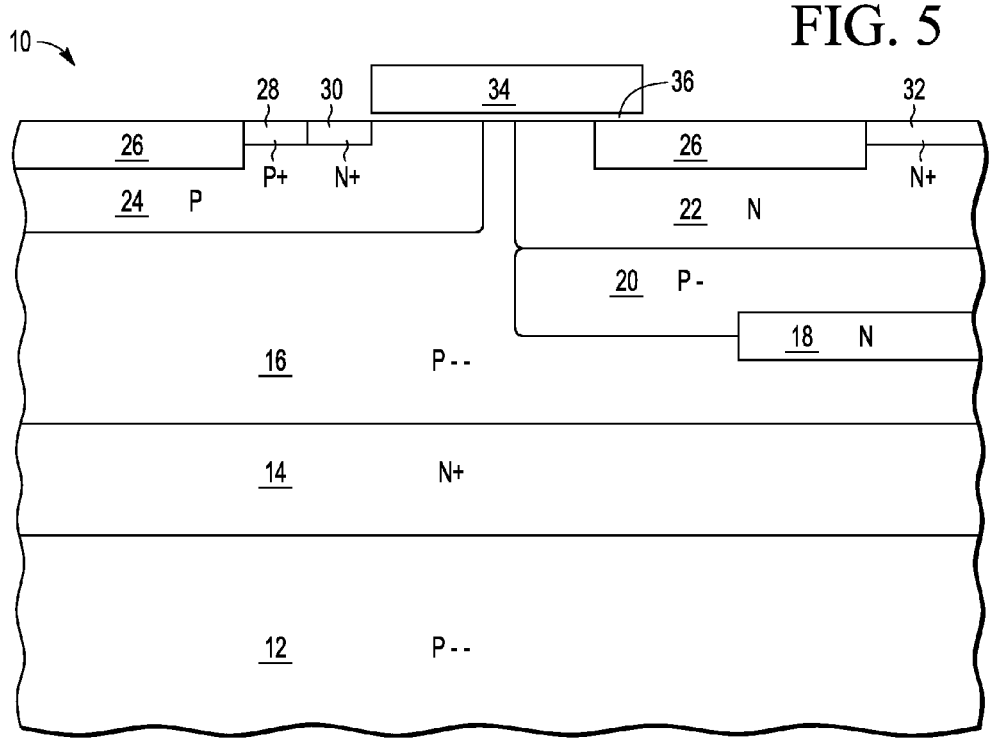
FIG. 5 is a cross section of the semiconductor device of FIG. 4 at a subsequent stage in processing and producing an LDMOS device.

Shown in FIG. 5 is semiconductor device 10 after completing the growth of layer of P-- layer 16 and performing steps to form an LDMOS device that is N channel. Thus the semiconductor P channel LDMOS devices can also be made by appropriately altering the conductivity types. For example, region 18 would be P type instead of N type and would redistribute holes instead of electrons. The steps for growing a P-- epitaxial layer and forming features in that layer to form an LDMOS are well understood by one of ordinary skill in the art. As shown in FIG. 5, a drain region 22 is formed of N type from a top surface of device 10 as shown in FIG. 5. An isolation region 26 extending from the surface of device 10 surrounds gate 34 and has one portion within region 22 and another portion within a body region 24. Body region 24 is doped to p type and is shown as P. Adjacent to isolation region 26 and within region 24 is a body contact 28 and a source 30. Source 30 is also a source contact. Source 30 and body contact 28 are typically hard-wired together and may be tied to ground for this example of an N channel LDMOS device. Source 30 is adjacent to gate 34 and body contact 28 is between source 30 and isolation region 26. Body region 24 extends from source 30 to within about 0.1 micron of drain region 22. Body 24 can extend all the way to drain 22. A doped region 20 is adjacent to, aligned with, and below drain 22. Region 20 is lightly doped to P type and is shown as P−. Region 20 extends past the top surface of carrier redistribution region 18 but not quite past the bottom surface of carrier redistribution region 18.

In operation, when gate 34 is below a threshold voltage of the LDMOS of FIG. 5, body 24 is not inverted and current blocked between drain 22 and source 30. Current conducts between drain 22 and source 30 when gate 34 receives a voltage above the threshold voltage of the LDMOS. When there is both a high current and a high voltage from drain to source, the electrons flowing from the source to the drain that make up this current tend to concentrate in the region along the bottom surface of isolation region 26 so the peak current density is present there. High current density results in impact ionization which results in forming electron/hole pairs which results in an undesired increase in current flow in body 24 which in turn may result in the base emitter junction of the parasitic bipolar transistor formed of drain 22, body 24 and P−− region 16, and source 30 becoming conductive and ultimately destroying the LDMOS device. With the presence of redistribution region 18, these electrons are somewhat attracted toward carrier redistribution region 18 which results in a reduction in peak current density and thus reduced impact ionization. If punchthrough is achieved through regions 16 and 20 to carrier redistribution layer 18, electrons may flow from drain 22 to buried layer 14 through carrier redistribution layer 18 resulting in reduced current flow to drain contact 32 and reducing peak current density in drain 22. On the other hand, even if there is electron flow from drain 22 to carrier redistribution layer 18, carrier redistribution layer 18 will attract electrons causing electron flow through drain 22 to not be as concentrated at the bottom surface of isolation region 26 and thus reducing peak current density and thus reducing impact ionization. In this example, the voltage at drain contact 32 and the voltage on buried layer 14 are intended to be the same while the current redistribution layer is electrically floating till there is punchthrough between this region and drain 22 or buried layer 14. Thus for some voltages there will be punchthrough between buried layer 14 and carrier redistribution layer 18 but not between drain 22 and carrier redistribution layer 18.

With the presence of carrier redistribution layer 18, the distance from buried layer to body 24 can be increased from what would be necessary if buried layer 14 was brought closer to drain 22 to achieve the needed reduction in impact ionization. The result of carrier redistribution layer 18 then is to achieve the needed reduction in impact ionization while still retaining substantial distance between body 24 and buried layer 14 for achieving a high breakdown voltage between body 24 and buried layer 14.

Figure 6:
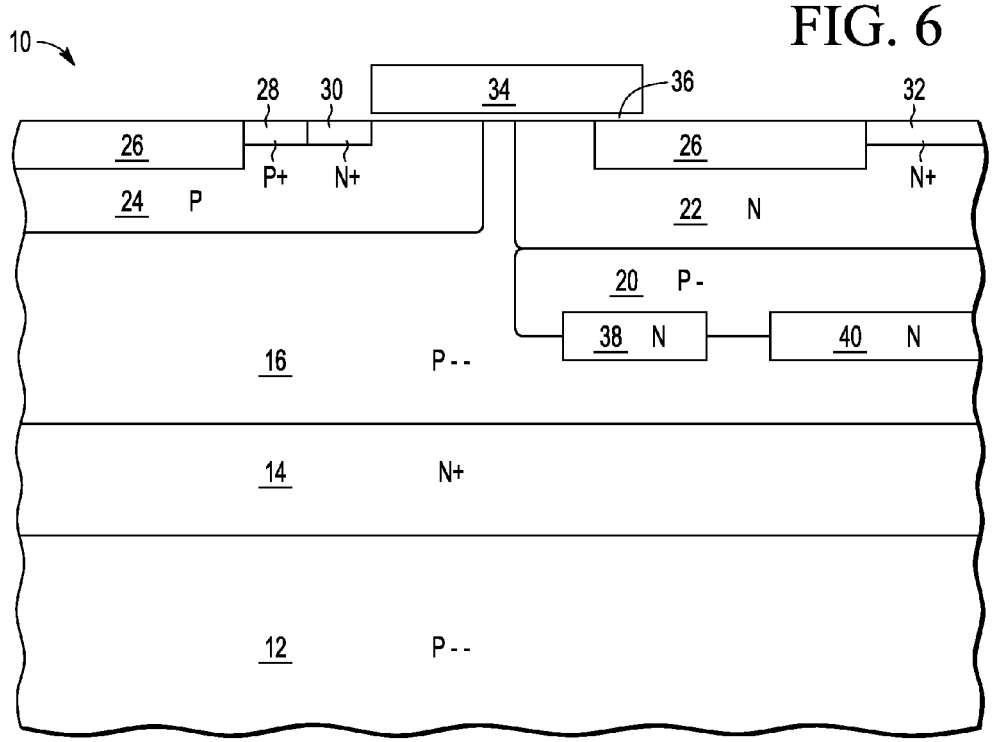
FIG. 6 is a cross section of a first alternative LDMOS device to that shown in FIG. 5.
Figure 7:
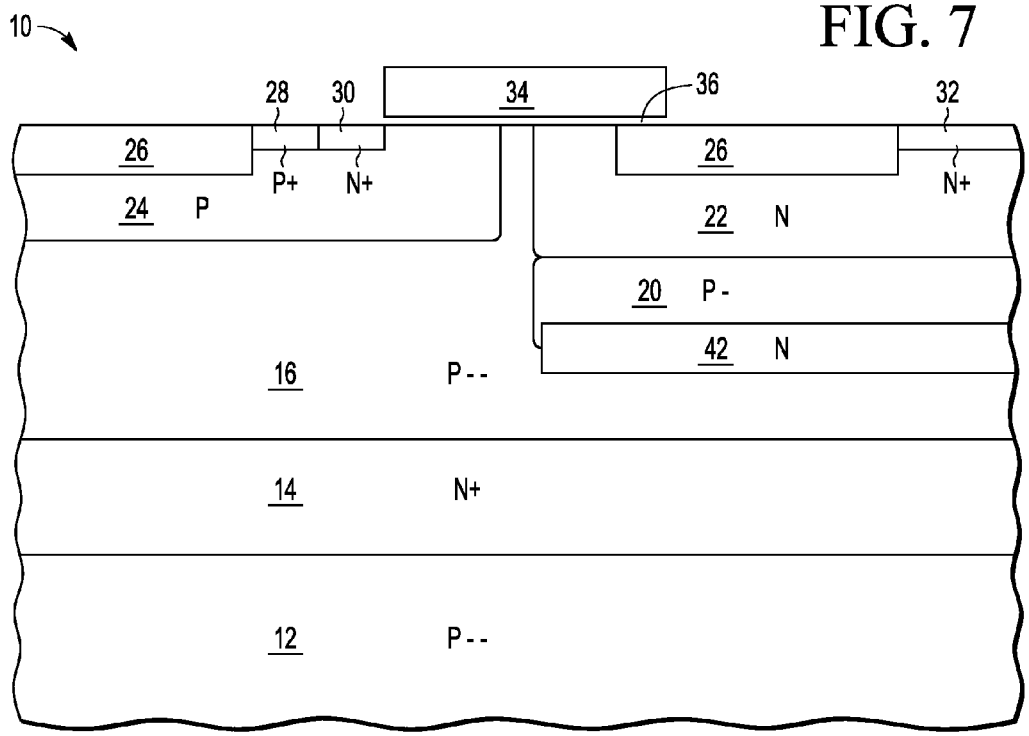
FIG. 7 is a cross section of a second alternative LDMOS device to that shown in FIG. 5.

Shown in FIGS. 6 and 7 are alternatives for increasing the effect of a carrier redistribution layer on the current density in drain 22. In FIG. 6, two laterally space carrier redistribution layers 38 and 40 replace carrier redistribution layer 18. These two carrier redistribution layers 38 and 40 would be formed at the same time as for carrier redistribution layer 18. In FIG. 7, a carrier redistribution layer 42 extends to substantially the end of drain 22. This can be viewed as being the same as FIG. 5 except carrier redistribution layer 42 is longer than carrier redistribution layer 18. In both FIG. 6 and FIG. 7, the influence of carrier redistribution extends its influence over a greater length of drain 22 than it does in FIG. 5.

Figure 8:
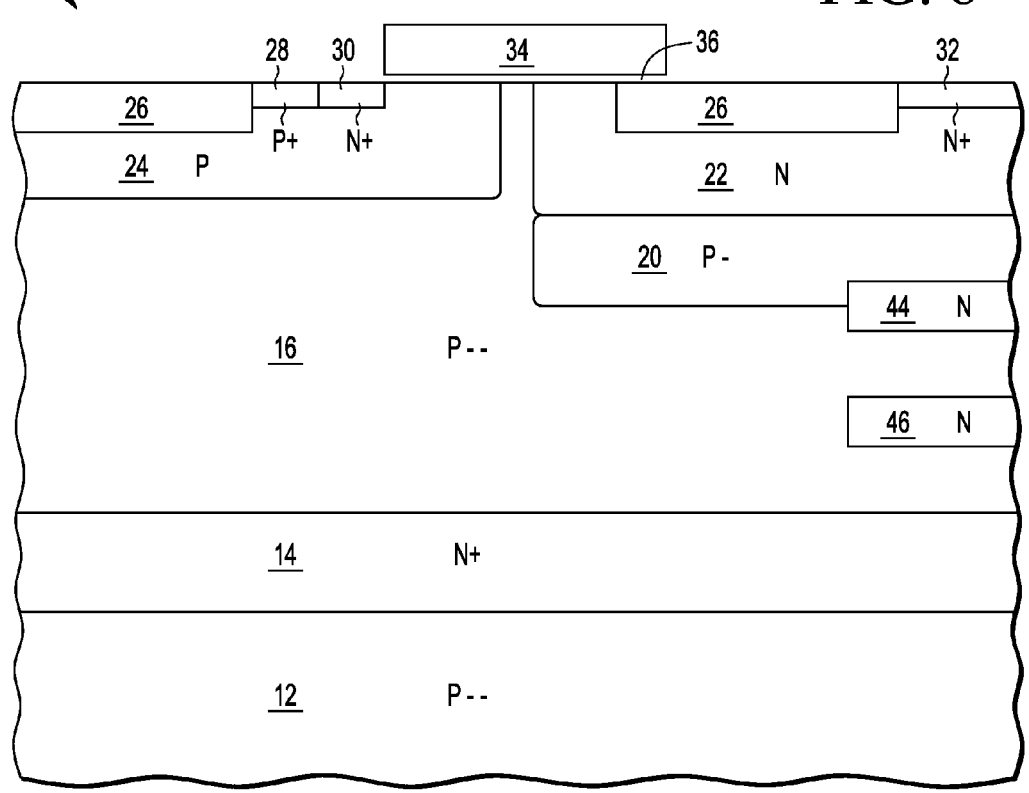
FIG. 8 is a cross section of a third alternative LDMOS device to that shown in FIG. 5.

Shown in FIG. 8 is an alternative LDMOS in which the distance between body 24 and buried layer 14 can be further increased by having carrier redistribution layers vertically stacked. FIG. 8 shows a carrier redistribution layer 44 in the same relationship to drain 22 as carrier redistribution layer 18 of FIG. 5 and an additional carrier redistribution layer 46 spaced below carrier redistribution layer 44. The spacing between carrier redistribution layers 44 and 46 is the same as between buried layer 14 and carrier redistribution layer 18 in this example. In such case, punchthrough from buried layer 14 to carrier redistribution layer 46 which would be followed by punchthrough between carrier redistribution layer 46 and 44 which would establish the voltage at buried layer 14 as the voltage at carrier redistribution layer 44. The carrier redistribution effect on peak current in drain 22 by carrier redistribution layer 44 would thus be described in the same manner as described for carrier redistribution layer 18 on peak drain current in drain 22 as shown in FIG. 5. Also the examples in FIGS. 6 and 7 can be similarly stacked as shown in FIG. 8.

In each example, distances between from the carrier redistribution layer to the buried layer and the drain can be tuned to achieve some desired result. For example, the actual voltage at which punchthrough occurs can be adjusted for example, or the relationship between punchthrough to the drain versus punchthrough to the buried layer can be tuned. Exemplary doping levels include 3-6e 16/cm for drain 22, 3-6e 16/cm for region 20, 4-8e 16/cm for carrier redistribution layers 18, 38, 40, 42, 44, and 46, 5e17/cm for body 24, 1e 15/cm for P−− region 16, 1e 15/cm for substrate 12, 1e 19/cm for buried layer 14, and 1e 20/cm for body contact 28, source 30, and drain contact 32.

Thus it is seen that the use of a carrier redistribution layer can be useful in achieving an improved safe operating area by avoiding a conductive parasitic bipolar and increasing the body to buried layer breakdown voltage.

The semiconductor substrate described herein can be any semiconductor material or combinations of materials, such as gallium arsenide, silicon germanium, monocrystalline silicon, the like, and combinations of the above.

By now it should be appreciated that there has been provided a double diffused metal oxide semiconductor device. The device includes a first well region having a first conductivity type. The device further includes a first doped buried semiconductor region having the first conductivity type. The first doped buried semiconductor region has a further characterization by which the first doped buried semiconductor region is under the first well region but is not in physical contact with the first well region. The first doped buried semiconductor region has a further characterization by which the doped buried semiconductor well is capable of redistributing carriers in the first well region. The device further includes a buried layer under the doped buried semiconductor well region. The buried layer has a further characterization by which the buried layer has the first conductivity type. The buried layer has a further characterization by which the buried layer is doped at a concentration greater than that of the first well region and greater than that of the first doped buried semiconductor region. The buried layer has a further characterization by which the buried layer is electrically tied to the first well region. The device may further include an epitaxial layer having a second conductivity type, wherein the second conductivity type is different in type than the first conductivity type and the epitaxial layer completely surrounds the doped buried semiconductor well region. The device may further include a drain contact region within the first well region, wherein the drain contact region has the first conductivity type, is highly doped at a concentration greater than that of the first well region. The device may further include a second well region laterally adjacent the first well region, wherein the second well region has the second conductivity type. The device may further include a first source region within the second well region, wherein the first source region has the second conductivity and is doped at a concentration greater than that of the second well region; and a second source region within the second well region, wherein the second source region has the first conductivity type and is doped at a concentration greater than that of the second well region; and the second source region is electrically shorted to the first source region: The device may further include a gate insulating layer over a portion of the first well region, a portion of the second well region, and a portion of the epitaxial layer; and a gate electrode over the gate insulating layer, the portion of the first well region, the portion of the second well region, and the portion of the epitaxial layer. The device may have a further characterization by which the first conductivity type is n-type and the second conductivity type is p-type. The device may have a further characterization by which the first doped buried semiconductor region is under the drain contact region. The device may have a further characterization by which the doped buried semiconductor region is also under a portion of the gate electrode. The device may further include a second doped buried semiconductor region having the first conductivity type, wherein the second doped buried semiconductor region is under the first well region but is not in physical contact with the first well region; and the second doped buried semiconductor region is capable of redistributing carriers in the first well region. The device may have a further characterization by which the first doped buried semiconductor region is above the second doped buried semiconductor region. The device may have a further characterization by which the first doped buried semiconductor region is laterally adjacent the second doped buried semiconductor region.

Described also is a laterally double diffused metal oxide semiconductor device. The device includes a first well region having a first conductivity type. The device further includes a first carrier redistribution region having the first conductivity type, wherein a second well region is under the first well region. The device further includes a highly doped buried layer under the second well region. The highly doped buried layer has a further characterization by which the highly doped buried layer has the first conductivity type and has a dopant concentration greater than that of the first well region and greater than that of the first carrier redistribution region. The highly doped buried layer has a further characterization by which the buried layer is tied to the first well region. The device may have a further characterization by which the first conductivity type is n-type and the second conductivity type is p-type. The device may further include a highly doped region within the well region; and a gate electrode over the well region but not over the highly doped region; wherein the first carrier redistribution region is under the highly doped region and a portion of the gate electrode. The device may further include a highly doped region within the well region and a gate electrode over the well region but not over the highly doped region; and wherein the first carrier redistribution region is under the highly doped region but not under the gate electrode. The device may further include a second carrier redistribution region having the first conductivity type, wherein the second carrier redistribution region is highly doped; the second carrier redistribution region is under the well region; and the second carrier redistribution region is under the first carrier redistribution region. The device may further include a second carrier redistribution region having the first conductivity type, wherein the second carrier redistribution region is highly doped; the second carrier redistribution region is under the well region; and the second carrier redistribution region is laterally adjacent the first carrier redistribution region. The device may further include an epitaxial layer having a second conductivity type, wherein the second conductivity type is different in type than the first conductivity type and the epitaxial layer completely surrounds the first carrier redistribution region.

Also described is a method for forming a laterally double diffused metal oxide semiconductor device. The method includes providing a semiconductor substrate having a first conductivity type. The method further includes forming a highly doped buried layer over the semiconductor substrate, wherein: the highly doped buried layer has a second conductivity type; and the first conductivity type is different than the second conductivity type. The method further includes forming an epitaxial layer and an carrier redistribution region over the highly doped buried layer comprising: epitaxially growing a first portion of the epitaxial layer over the highly doped buried layer having the first conductivity type; implanting a second conductivity type within the first portion of the epitaxial layer to form the carrier redistribution region; and epitaxially growing a second portion of the epitaxial layer over the first portion of the epitaxial layer and the carrier redistribution region. The method further includes forming a well region over the carrier redistribution region, wherein: the well region has the second conductivity type with a concentration less than the highly doped buried layer; and the well region is electrically tied to the highly doped buried layer.

Although the invention is described herein with reference to specific embodiments, various modifications and changes can be made without departing from the scope of the present invention as set forth in the claims below. For example, the different dimensions and doping levels are examples and can be varied and for any given process the particular parameters necessary to achieve a desired result may be different from another process. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A laterally double diffused metal oxide semiconductor device comprising:
   a first well region having a first conductivity type;
   a first doped buried semiconductor region having the first conductivity type, wherein
      the first doped buried semiconductor region is under the first well region but is not in physical contact with the first well region, and
      the first doped buried semiconductor well is capable of redistributing carriers in the first well region;
   a buried layer under the first doped buried semiconductor well region, wherein
      the buried layer has the first conductivity type,
      the buried layer is doped at a concentration greater than that of the first well region and greater than that of the first doped buried semiconductor region, and
      the buried layer is electrically tied to the first well region; and
   an epitaxial layer having a second conductivity type, wherein
      the epitaxial layer is adjacent to at least a portion of the first doped buried semiconductor region,
      the second conductivity type is different in type than the first conductivity type, and
      the epitaxial layer completely surrounds the first doped buried semiconductor region;
   a drain contact region within the first well region wherein the drain contact region has the first conductivity type and is highly doped at a concentration greater than that of the first well region
   a second doped buried semiconductor region having the first conductivity type, wherein:
      the second doped buried semiconductor region is under the first well region but is not in physical contact with the first well region; and
      the second doped buried semiconductor region is capable of redistributing carriers in the first well region.

2. The device of claim 1, wherein the first doped buried semiconductor region is above the second doped buried semiconductor region.

3. The device of claim 1, wherein the first doped buried semiconductor region is laterally adjacent the second doped buried semiconductor region.

4. A laterally double diffused metal oxide semiconductor device comprising:
   a first well region having a first conductivity type;
   a first carrier redistribution region having the first conductivity type, wherein a second well region is under the first well region;
   a highly doped buried layer under the second well region, wherein:
      the highly doped buried layer has the first conductivity type and has a dopant concentration greater than that of the first well region and greater than that of the first carrier redistribution region; and
      the buried layer is tied to the first well region; and
   a second carrier redistribution region having the first conductivity type, wherein
      the second carrier redistribution region is highly doped,
      the second carrier redistribution region is under the second well region.

5. The device of claim 4, wherein:
   the second carrier redistribution region is under the first carrier redistribution region.

6. The device of claim 4, wherein:
   the second carrier redistribution region is laterally adjacent the first carrier redistribution region.

* * * * *